(12) United States Patent
Baechle et al.

(10) Patent No.: US 7,205,872 B2
(45) Date of Patent: Apr. 17, 2007

(54) ELECTROMAGNETIC LOCKING SYSTEM FOR A SAFETY SWITCH

(75) Inventors: Erik Baechle, Filderstadt (DE); Walter Link, Rutesheim (DE)

(73) Assignee: Euchner GmbH & Co. KG, Leinfeblen-Echterdingen (DE)

( * ) Notice: Subject to any disclaimer, the term of this patent is extended or adjusted under 35 U.S.C. 154(b) by 0 days.

(21) Appl. No.: 10/509,618

(22) PCT Filed: Apr. 3, 2003

(86) PCT No.: PCT/EP03/03494

§ 371 (c)(1),
(2), (4) Date: Sep. 29, 2004

(87) PCT Pub. No.: WO03/085833

PCT Pub. Date: Oct. 16, 2003

(65) Prior Publication Data

US 2005/0160777 A1    Jul. 28, 2005

(30) Foreign Application Priority Data

Apr. 8, 2002  (DE) ................................ 102 16 225

(51) Int. Cl.
*H01H 9/00* (2006.01)
(52) U.S. Cl. ........................ 335/207; 335/205
(58) Field of Classification Search ........ 335/205–207, 335/305–307, 151–154
See application file for complete search history.

(56) References Cited

U.S. PATENT DOCUMENTS

| 5,429,399 | A | * | 7/1995 | Geringer et al. ............. 292/92 |
|---|---|---|---|---|
| 6,409,083 | B1 | | 6/2002 | Link |
| 6,539,760 | B1 | * | 4/2003 | Letzel et al. ................. 70/276 |
| 6,609,738 | B1 | * | 8/2003 | Roth et al. ................ 292/251.5 |
| 6,801,112 | B1 | * | 10/2004 | Saxer ......................... 335/205 |
| 6,818,177 | B1 | * | 11/2004 | Turcotte ....................... 422/24 |
| 6,989,727 | B2 | | 1/2006 | Baechle |
| 2004/0051608 | A1 | * | 3/2004 | Donce ......................... 335/256 |

FOREIGN PATENT DOCUMENTS

| DE | 198 40 620 C1 | 4/2000 |
|---|---|---|
| DE | 199 37 947 A1 | 3/2001 |
| DE | 199 53 898 A1 | 8/2001 |

\* cited by examiner

*Primary Examiner*—Elvin Enad
*Assistant Examiner*—Bernard Rojas
(74) *Attorney, Agent, or Firm*—Roylance, Abrams, Berdo & Goodman, L.L.P.

(57) ABSTRACT

A locking system (1) for a safety switch includes a read head (2) and an actuator (3), each of which is provided with first or second componentry (10, 14) encompassing electrical and/or electronic components that interact with each other in an electrically contactless manner, thereby controlling the safety switch. The locking system actuator (3) can be locked to the read head (2) by a switchable electromagnet (7) which interacts with a counterelement (12). The locking action is controlled by a sensor element (31, 32, 33, 34), the output signal of which depends on the magnetic field generated by the electromagnet (7).

14 Claims, 7 Drawing Sheets

ELECTROMAGNETIC LOCKING SYSTEM FOR A SAFETY SWITCH

FIELD OF THE INVENTION

The present invention relates to a locking system for a safety switch having a read bead and an actuator, each with electrical components that interact without electrical contact to control the safety switch.

BACKGROUND OF THE INVENTION

Safety switches with a read head and an actuator, each having a first and/or second component set with electric and/or electronic structural elements which may be caused to interact without electric contact and as a result control the safety switch, are disclosed in DE 197 11 588 A1, for example. Such safety switches may be used to monitor movable protective devices, e.g., doors, covers, grates, and the like of machinery and equipment. As a rule, the safety switch interrupts one or more electric circuits when the relevant protective device is transferred to a safer operating state, is switched off, for example, or switching on of the device is prevented.

The actuator generally is introduced in a channel formed by the read head. When assembled, the actuator in the read head may be mechanically locked and as a result the protective device may be kept locked. Locking in conventional systems is accomplished as a result of extension of a rod directly through an opening in the actuator or blocking of a control gear in the read head operating in conjunction with the actuator. In order for it to be possible to apply the locking forces required, 1000 N, for example, as a function of the application the locking system, and accordingly, the safety switch, must be designed to be sufficiently rugged from the mechanical viewpoint.

As an alternative or in addition to the mechanical locking, the locking may be effected by electromagnetic forces, which are, of course, heavily dependent on the distance between the electromagnet and the associated counterelement. In particular, the electromagnetic forces decrease sharply with increase in distance. The fouling of the safety switch and of the locking system which occurs may impair provision of high locking forces and other aspects of operation in fouling environments, such as in the vicinity of metal-cutting machine tools.

DE 199 53 898 A1 discloses an access protection device having a U-shaped holding magnet. A configuration having a rotatable U-shaped permanent magnet is described. A first reed contact detects the rotary position of the permanent magnet, that is, engagement or disengagement of the magnetic locking action. A second reed contact detects the presence or absence of the counterelement, that is, whether the protective door is closed or not.

DE 198 40 620 C1 discloses a contact-free safety switch having a Hall sensor mounted on the read head and a permanent magnet mounted on the actuator. The Hall sensor monitors the closed position. The switching threshold of the Hall sensor is adjustable by a trimming resistor.

SUMMARY OF THE INVENTION

An object of the present invention is an improved locking system of a safety switch, especially with reliable monitoring of locking by electromagnetic forces.

According to the present invention, a locking system of a safety switch has a read head and an actuator, each having a first component set and/or second component set with electric and/or electronic structural elements which may be alternately engaged and disengaged without the use of electric contacts so that the safety switch may be controlled. The actuator may be locked on the read head by a switchable electromagnet operating in conjunction with a counterelement. The locking may be controlled by a sensor element, the output signal of which depends on the magnetic field which may be generated by the electromagnet.

None of the state-of-the-art or conventional publications disclose a sensor element which provides an analog output signal by which the intensity of the magnetic field of an electromagnet and accordingly the locking force generated may be monitored. By using an electromagnet of the present invention, this locking force is continuously adjustable by suitable electric actuation. In contrast, only one switching state or one position is determined discretely and digitally by the known conventional sensor elements to establish whether the permanent magnet has been rotated to the locking position or whether the protective door is closed. The adjustability of the locking force also permits automatic association, in particular under program control, of different operating conditions of the machine to be monitored with different locking forces for the respective protective mechanism.

Electric contact-free interaction of read head and actuator may be effected with all known processes of the state of the art, in the simplest case by damping of electromagnetic waves, especially those of an electromagnetic field. As an alternative, a transponder system may be used in which identification signals are exchanged electrically, free of contact, between read head and actuator. In the state of the art, the three-dimensional area of response of the interactive system is used only to a limited extent, and a relatively precise orientation of read head and actuator toward each other in the assembled state is required.

The locking is not effected at all or at any rate is not effected exclusively by a bar which may be moved transversely to the direction of movement of the actuator, but rather by the action of an electromagnetic force on the counterelement. The electromagnet may be switched by the safety switch itself, and/or an associated control mechanism, and/or the machine associated with the safety switch. The level of the locking force may be adjusted, for example, as a function of the operating state of the associated machine. Preferably, the counterelement and/or the electromagnet is mounted to be pivotable relative to the base element. During locking, the electromagnet and the actuator are positioned so close to each other that sufficiently high locking forces may be achieved. In addition, the first and/or second component set preferably is integrated with the respective counterelement, so that interaction of the component sets is reliably ensured even under adverse conditions, for example, even in the event of angular displacement of the protective mechanism.

In one particular embodiment, the sensor element is mounted in the actuator. Preferably, the actuator has the base element, the counterelement, and the second component set. In particular, these elements form the actuator. As an alternative or in addition, the read head as well may have one or more sensor elements. It is conceivable, for example, that the damping of the magnetic field generated by the electromagnet could be measured directly in the read head.

Independently of the number and configuration of the one or more sensor elements, the safety switch may be controlled by direct or indirect coupling of the output signal of the sensor and by interaction of the first and second component sets. Direct coupling is effected, for example, when the first set and/or second set may be operated only if the sensor element provides a suitable output signal. Indirect coupling is effected, for example, if the output signal of the first component set and/or second component set is received by superordinate control electronics and the output signal of the sensor element is also received independently of this circumstance. Linking of the two output signals then occurs in the superordinate control electronics, which, for example, determines if an operating state of the machine to be monitored exists for which the output signal of the sensor element is relevant.

In one preferred embodiment of the present invention, the sensor element may assume two switching states as a function of the magnetic field which may be generated by the electromagnet. Preferably, the second component set mounted in the actuator is controlled by the switching states of the sensor element. This control yields the advantage that the actuator may be developed without external electric connections. All the electric or other connections required are preferably mounted within the actuator to be protected from disruptive influences of a mechanical or other nature from coming from the exterior. The sensor element may also be mounted directly on or in the second component set of the actuator or may be integrated into it. It is, of course, advantageous in many applications for the sensor element of the second component set to be positioned some distance away on the actuator. Preferably, at least one sensor element is mounted in an edge area of the actuator to determine not just one or in any event only one axial distance from the electromagnet, but also displacement in a direction perpendicular to the direction of movement of the relative movement between electromagnet and actuator.

In one preferred embodiment of the present invention, a generator coil is mounted in the actuator to provide electric energy for the second component set. This generator coil generally receives an electromagnetic signal from the first component set of the read head. This signal generates the voltage required or the current required for operation of the electric and/or electronic components.

In one especially simple embodiment of the present invention, the sensor element is connected electrically in series to the generator coil. This connection makes it possible to switch on the power supply for the second component set in the actuator only if the sensor element detects a sufficiently high or sufficiently low magnetic field generated by the electromagnet.

If several sensor elements are mounted on the actuator and/or the read head, their output signals may be interconnected as desired to monitor the locking. Three-dimensional or in any event two-dimensional distribution of the several sensor elements in keeping with the respective requirements and geometric relationships, for example, on the mounting surface of the actuator in particular, is advantageous. The relative position of the actuator in relation to the electromagnet in the locked state may also be determined in this way.

The position of one or more of the sensor elements may be adjusted by individual or collective adjustment means. The adjustment may generally be made in all three spatial directions and/or in rotary directions. In many applications, however, the possibility of adjustment in the direction of the relative movement of actuator and electromagnet or at an angle of 90° to such movement is a consideration of importance.

In one particular embodiment, the sensor element has a reed contact and/or a Hall element. In particular, the sensor element may be in the form of a reed contact or a Hall element. A Hall element presents the advantage over a reed contact, not only that one or more switching points may be assigned but also that an analog output signal relating to the intensity of the magnetic field generated by the electromagnet may be produced.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings which form a part of this disclosure.

DETAILED DESCRIPTION OF THE INVENTION

Figure 1:
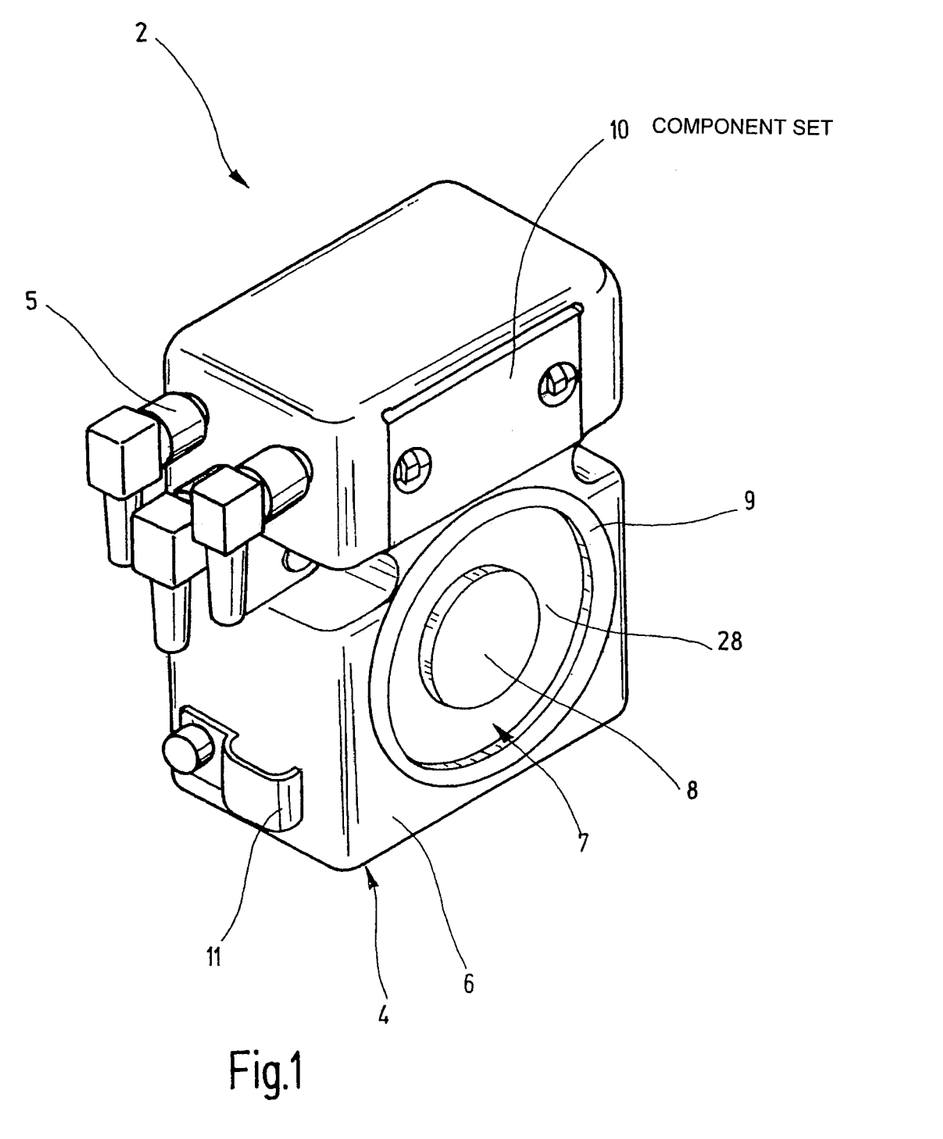
FIG. 1 is a perspective view of a read head of a safety switch having a locking system according to a first embodiment of the present invention.
Figure 4:
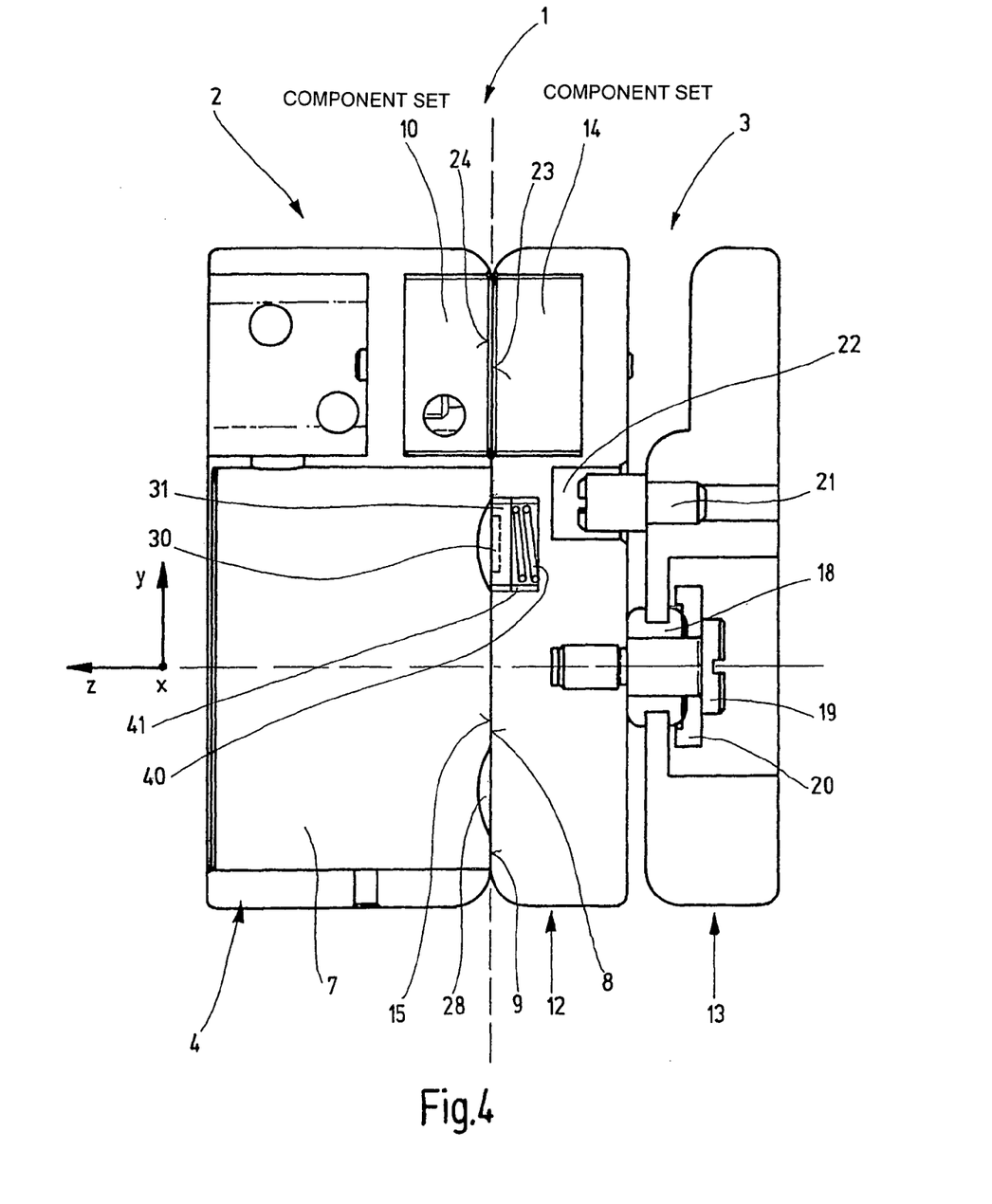
FIG. 4 is a side elevational view in a section of the read head of FIG. 1 and the actuator of FIG. 2 of the locking system in the assembled state.

FIG. 1 presents a perspective view of the read head 2 of a safety switch have a locking system 1 according to the present invention (FIG. 4). The read head 2 is at least a part of the safety switch (not shown). The electric switching function may be performed inside the head housing 4 or in a switching component of the safety switch mounted remote from the head housing 4. Electric contact of the read head 2 is effected by one or more plug-and-socket connectors 5. The head housing 4 is more or less square in shape, with an essentially rectangular and preferably planar front surface 6. Below its center, the head housing 4 has a cylindrical boring with a longitudinal axis forming a right angle with the front surface 6 and receiving electromagnet 7. In one preferred exemplary embodiment, the read head 2 is secured by the head housing 4 on a frame of the protective device (not shown) or on the machine itself.

The electromagnet 7 has a more or less cylindrical housing forming on its side facing the actuator 3 a more or less round and preferably planar mounting surface 8. The housing of the electromagnet 7 is within a radially outwardly spaced annular, and preferably planar, edge 9 separated from the first mounting surface 8 by an annular groove 28. The first mounting surface 8, the annular edge 9, and the front surface 6 preferably are positioned in one plane.

The first component set 10 is mounted to be stationary above and relative to the electromagnet 7 in the head housing 4. In particular, set 10 is detachably or non-detachably secured by a threaded connection to the head housing 4. The wiring between the first component set 10, the electromagnet 7, and the connections for the plug-and-socket connectors 5 preferably are mounted inside the head housing 4. A cable clip 11 for securing the connecting lines for the plug-and-socket connector 5 is mounted on a side surface on the head housing 4. The preferably planar front surface or third mounting surface 23 (FIG. 4) of the first component set 10 is aligned with the first mounting surface 8 or is offset slightly to the rear of this surface.

Figure 2:
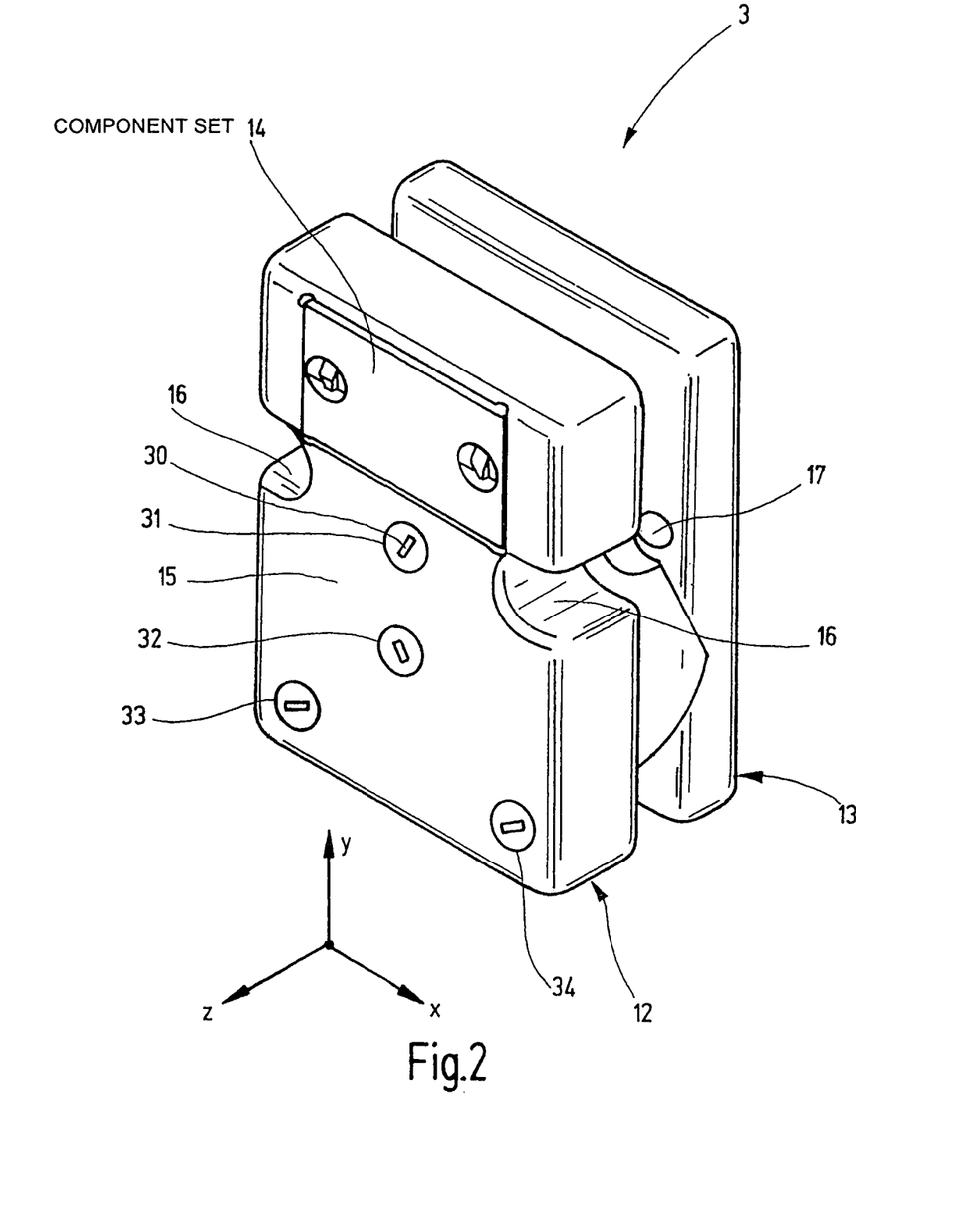
FIG. 2 is a perspective view of an accompanying actuator according to a first embodiment of the present invention.

FIG. 2 presents a perspective view of an associated actuator 3 which has a counterelement 12, such as one of steel, by which the actuator 3 may be secured on the read head 2 by the electromagnet 7 and by which the protective mechanism may be locked. The counterelement 12 may be in one piece of steel or only partly so, for example, for the purpose of forming a frame of aluminum for seating an insert operating in conjunction with the electromagnet. The counterelement 12 is rigidly connected to an associated base element 13, such as one of aluminum, but is pivotable relative to this element, as is explained in the following description in connection with FIG. 4. The second component set 14, which may be made to interact with the first component set 10 of the read head 2 in the absence of electric contact, is rigidly connected to the counterelement 12. Preferably, it is detachably attached to counterelement 12 by fastening screws.

The counterelement 12 forms a preferably planar second mounting surface 15 which may be brought into surface-to-surface contact with the first mounting surface 8 of the read head 2 during the locking process. The preferably planar front surface or fourth mounting surface 24 (FIG. 4) of the second component set 14 is aligned with the second mounting surface 15 or is slightly offset relative to this mounting surface. It is essential in the process for the configuration of the first and second component sets 10, 14 to ensure establishment of contact between the first and second mounting surfaces 8, 15 of the electromagnet 7 and respectively of the counterelement 12, since especially great locking forces may be thereby achieved.

The actuator 3 is secured, for example, on a protective mechanism by the base element 13 for a machine switchable by the safety switch. The counterelement 12 together with the second component set 14 may be pivoted relative to this protective device about the three spatial directions or axes x, y, z shown in FIG. 2. Each axis encloses a right angle relative to each other. The direction of spacing between the counterelement 12 and the base element 13 is represented in this instance by the spatial direction z. In the main, the counterelement 12 may not be displaced relative to the base element 13 in this direction of spacing z. Both the counterelement 12 and the base element 13 have a more or less rectangular basic shape with rounded edges. The grooved recesses 16 in the counterelement 12 serve the purpose of accessibility of the fastening means, screws in particular, which may be introduced into the fastening openings 17 in the base element 13 and may be used to secure the actuator 3 on the movable part of the protective mechanism.

In the embodiment illustrated, the second component set 14 has no connecting lines, so that establishment of electric contact with the actuator 3 is not necessary. Preferably, energy is conducted to the second component set 14 in the actuator 3 by the first component set 10 mounted in the read head 2 for the purpose of reading identification data stored in the second component set 14 and transmitting such data back to the first component set 10. In a simplified embodiment, the second component set 14 may only damp, as desired, an alternating electromagnetic field generated by the first component set 10, and, as a result, announce to the first component set 10 and the read head 2 respectively the presence of the of the second component set 14 and accordingly the closed position of the protective mechanism.

In the exemplary embodiment illustrated, a total of four sensor elements 31, 32, 33, 34 are mounted more or less centrally relative to the second mounting surface 15 and at the corners of an assumed isosceles triangle. Each sensor element is embedded in or secured on a suitable disk, circular in the exemplary embodiment, of plastic or the like. This plastic disk has, as adjusting means 30, an adjustment slot by which the position of the associated sensor element 31 may be adjusted in the direction of the z axis. The second sensor element 32 mounted in the center may be used to determine if a relevant magnetic field is at all present in the field surrounding the actuator 3. The first, third, and fourth sensor elements 31, 33, 34 located at the corners of the assumed isosceles triangle in addition make it possible to determine the position of the actuator 3, in particular, the position of the counterelement 12 relative to the magnetic field which may be present. The output signals of the sensor elements 31, 32, 33, 34 preferably are connected by use of the electric and/or electronic components in the second component set 14.

Figure 3A:
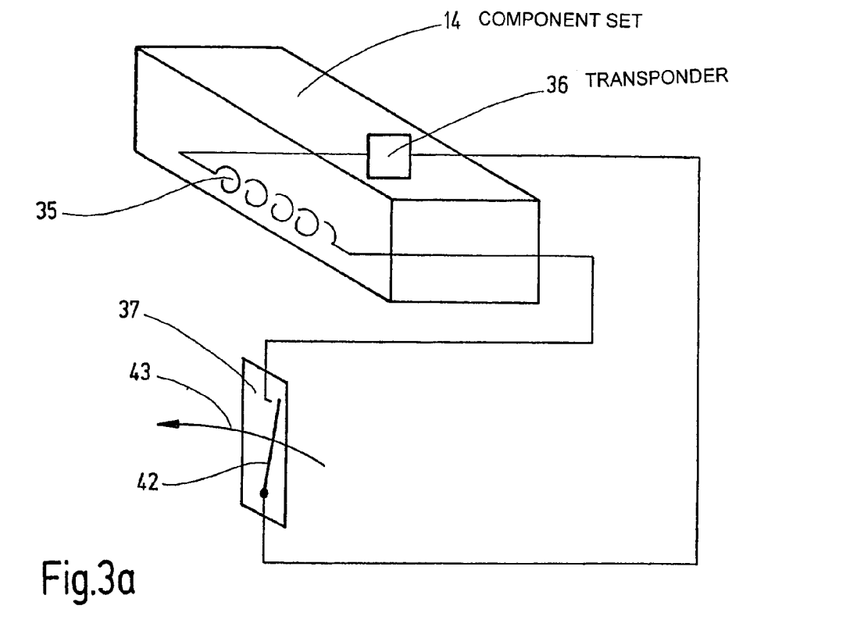
FIG. 3a is a diagrammatic, perspective view of the second component of the actuator of FIG. 2 in which a generator coil and a transponder are mounted, according to a first embodiment of the present invention.

FIG. 3*a* illustrates a first exemplary embodiment of the second component set 14, in which embodiment a generator coil 35 and a transponder 36 are mounted. A reed contact 37 mounted outside the second component set 14 in the embodiment illustrated is connected electrically in series to the generator coil 35. In the event of approach of the reed contact 37 to the vicinity of the magnetic field generated by the electromagnet 7, the contact stud 42 of the reed contact 37 is deflected in the direction of actuation 43. As a result of the deflection, the transponder 36 is connected electrically to the generator coil 35. In place of a make contact, use may also be made of a break contact which short-circuits when the generator coil 35 is not actuated, thereby preventing exchange of signals between the first and second component sets 10, 14.

Both the second component set 14 and the reed contact 37 are mounted on or in the actuator so that movement of the reed contact 37 and accordingly of the actuator 3 is accompanied by approach of the second component set 14 to the first component set 10 mounted in the read head 2. A suitable transmitting coil in the first component set 10 sends an electromagnetic signal which is received in the generator coil 35 and is converted at least to some extent back to electric energy. By this electric energy, a data signal stored in the transponder 36 is read out and transmitted back to the first component set 10 of the read head by the generator coil 35. However, this data signal may be read out only if the contact stud 42 has been deflected, such being the case only if the magnetic field generated by the electromagnet 7 is of an assigned strength such that, for example, locking to a sufficient extent is ensured.

Figure 3B:
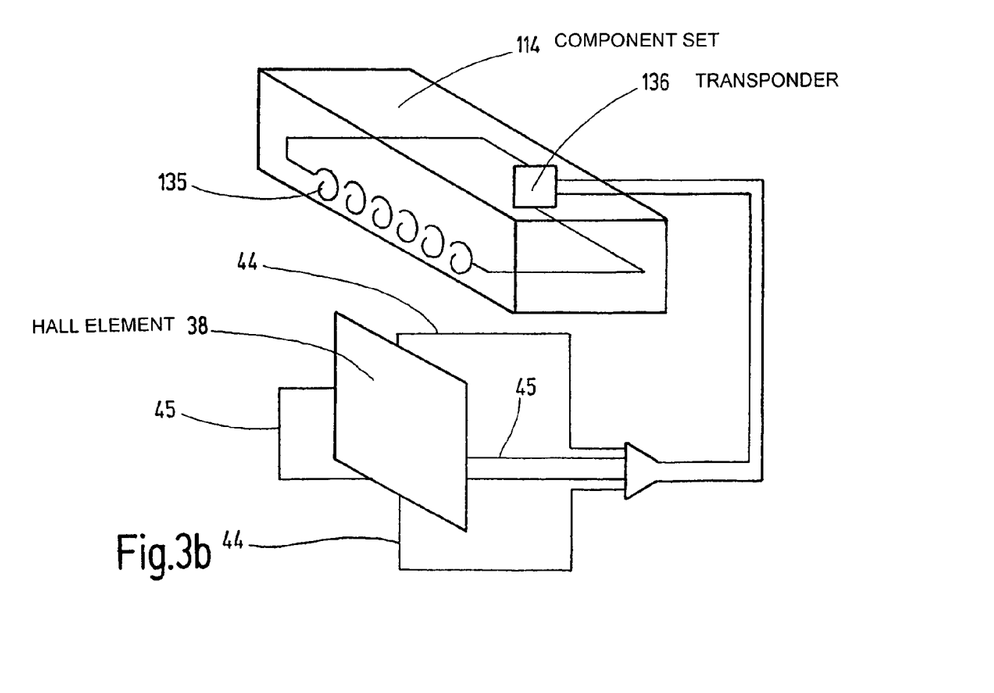
FIG. 3b is a diagrammatic perspective view of the second component of the actuator of FIG. 2 in which the transponder is connected directly to the generator coil, according to a second embodiment of the present invention.

FIG. 3*b* illustrates a second exemplary embodiment of the second component set 114 in which the transponder 136 is connected directly to the generator coil 135. Spaced a certain distance from the second component set 114, a sensor element in the form of a Hall element 38 is mounted, and is fed over the feed lines 44 from the transponder 136. The output lines 45 of the Hall element are extended back to the transponder 136 for evaluation.

FIG. 4 shows a section in the y/z plane through the read head 2 and the actuator 3 of the locking system 1 when assembled. The shape of the elastically deformable element or socket 18 is designed to be symmetrical in rotation relative to the direction of spacing or axis z. The washer 20 is designed to be more or less cupshaped and forms a stop especially during locking and the accompanying transfer of force from the counterelement 12 by the connecting element 19 to the base element 13, and accordingly from the read head 2 to the actuator 3 and respectively the protective device, and/or during screwing in of the connecting element 19 and/or swiveling of the counterelement 12 relative to the base element 13. The socket 18 is in contact with both the base element 13 and the connecting element 12. When vibrations or impacts occur, socket 18 damps the tendency of the counterelement 12 to oscillate, thereby preventing generation of noise or rattling such as is caused, for example, by impact of the counterelement 12 on the base element 13.

The first sensor element 31 may be screwed into a threaded opening 41 in the counterelement, against the action of an energy storing element 40, in the exemplary embodiment a helical spring. Insertion is effected preferably by engagement of a tool into the adjusting slot 30, or optionally by use of a suitable coin. Establishment of electric contact with the electric sensor element 31 is for the sake of clarity of illustration not shown in FIG. 4. It may be effected, for example, by sufficiently long connecting leads which subsequently are connected to component set 14. The threshold value when reached by the first sensor element 31 can cause element 31 to generate an assigned output signal. The output signal may be adjusted by rotation of the first sensor element 31 forward or backward. The first sensor element 31 is adjusted in the z direction only in the exemplary embodiment illustrated, but may also be adjusted in the x and y direction by suitable adjusting devices.

As a variation of the exemplary embodiment shown in FIG. 4, it may be advantageous to mount at least one sensor element 31, 32, 33, 34 near or on the surface of the counterelement 12 facing the base element 13, but in any event offset backward from the first mounting surface 8 of the counterelement 12. The sensor element 31, 32, 33, 34 and/or the associated adjusting means 30 in particular may be accessible from this rear side. As a result, a first mounting surface 8 of the counterelement 12 with at least some of its area closed may be provided, and the sensor element 31, 32, 33, 34 and/or the associated adjusting means 30 are mounted so as to be protected.

The adjusting means 30 may be actuated, above all in the direction of the z axis, by openings in the base element 13 and/or in the connecting element 19. The longitudinal axis of a reed contact 37 and/or the direction of switching of the latter may extend more or less in parallel with the z axis or enclose an angle more or less of 90° with this axis.

Figure 5:
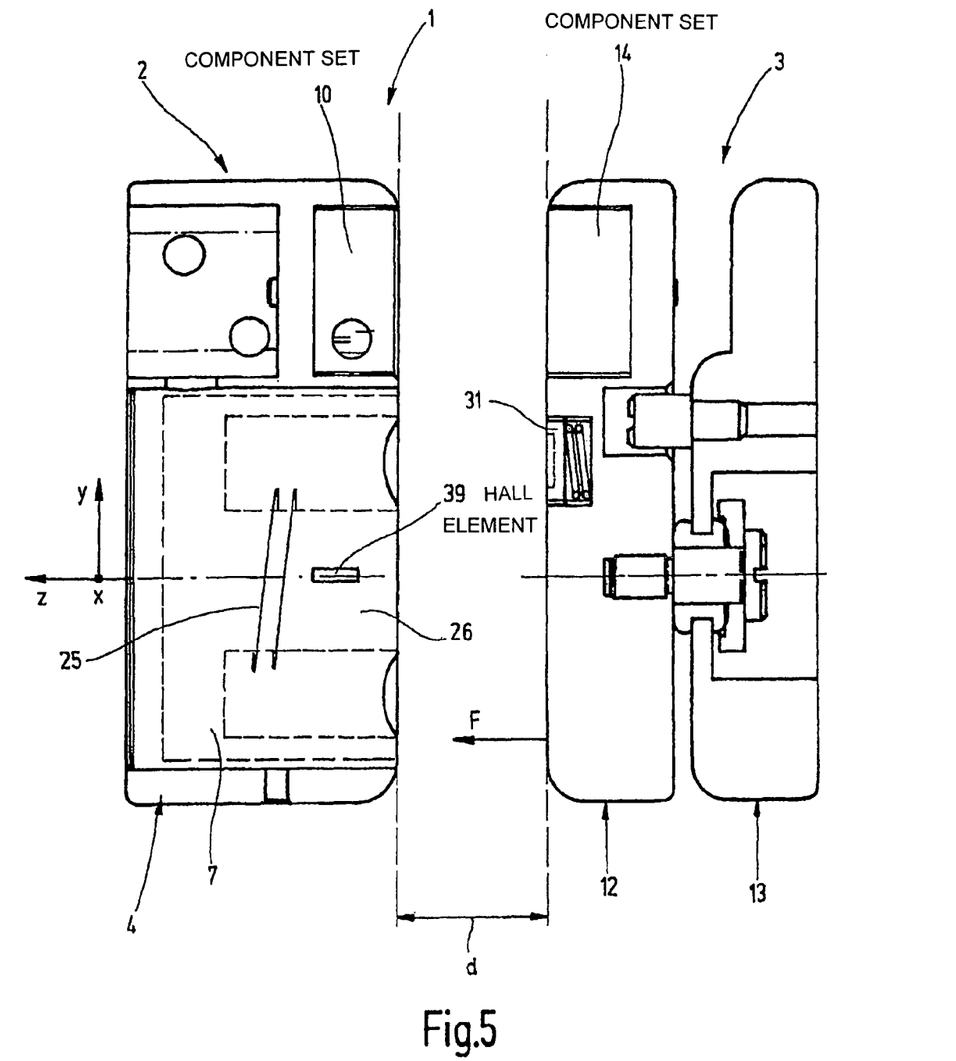
FIG. 5 is a side elevational view in a section of the locking system of FIG. 4 in a modified state.

FIG. 5 shows the locking system 1 in a state in which the actuator 3 is separated from the read head 2 by a distance d. The electromagnet 7 mounted in the read head 2 is represented by broken lines and has several turns 25. A magnetic field is induced in the coil core 26 when current is applied to the turns 25. Another or second Hall element 39 mounted in the coil core 26 determines the field intensity which occurs. This field intensity depends, among other things, on the distance d of the counterelement 12 of the actuator 3 short-circuiting the magnetic flux. In particular, the field intensity determined by the other Hall element 39, and accordingly, the associated hall voltage $U_{Hall}$ increase with decrease in distance d.

As an alternative or in addition, the first sensor element 31 in the actuator 3 may be in the form of a Hall element and measure the magnetic intensity present in the actuator 3 and respectively the associated magnetic induction. The associated magnetic induction also is a function of the distance d of the actuator 3 from the read head 2, and respectively, from the electromagnet 7.

The magnetic field intensity measured by the other Hall element 39 and/or by the first sensor element 31 is a gauge of the locking force F acting between the read head 2 and the actuator 3, in the case of a rigidly mounted read head 2 acting in particular on the actuator 3 and in the direction of the read head 2. There may accordingly be assigned for the other Hall element 39 and/or the first sensor element 31 threshold values which when reached may signal the control mechanism of a machine not only that the protective mechanism is closed, but also that there is present a locking force high enough to keep the protective mechanism reliably in the closed state. If the first sensor element 31 in the actuator 3 is used for this purpose, reaching of the assignable threshold value for the locking force F may be used to determine if an exchange of signals between the first and second component sets 10, 14 between actuator 3 and read head 2 is possible.

Figure 6:
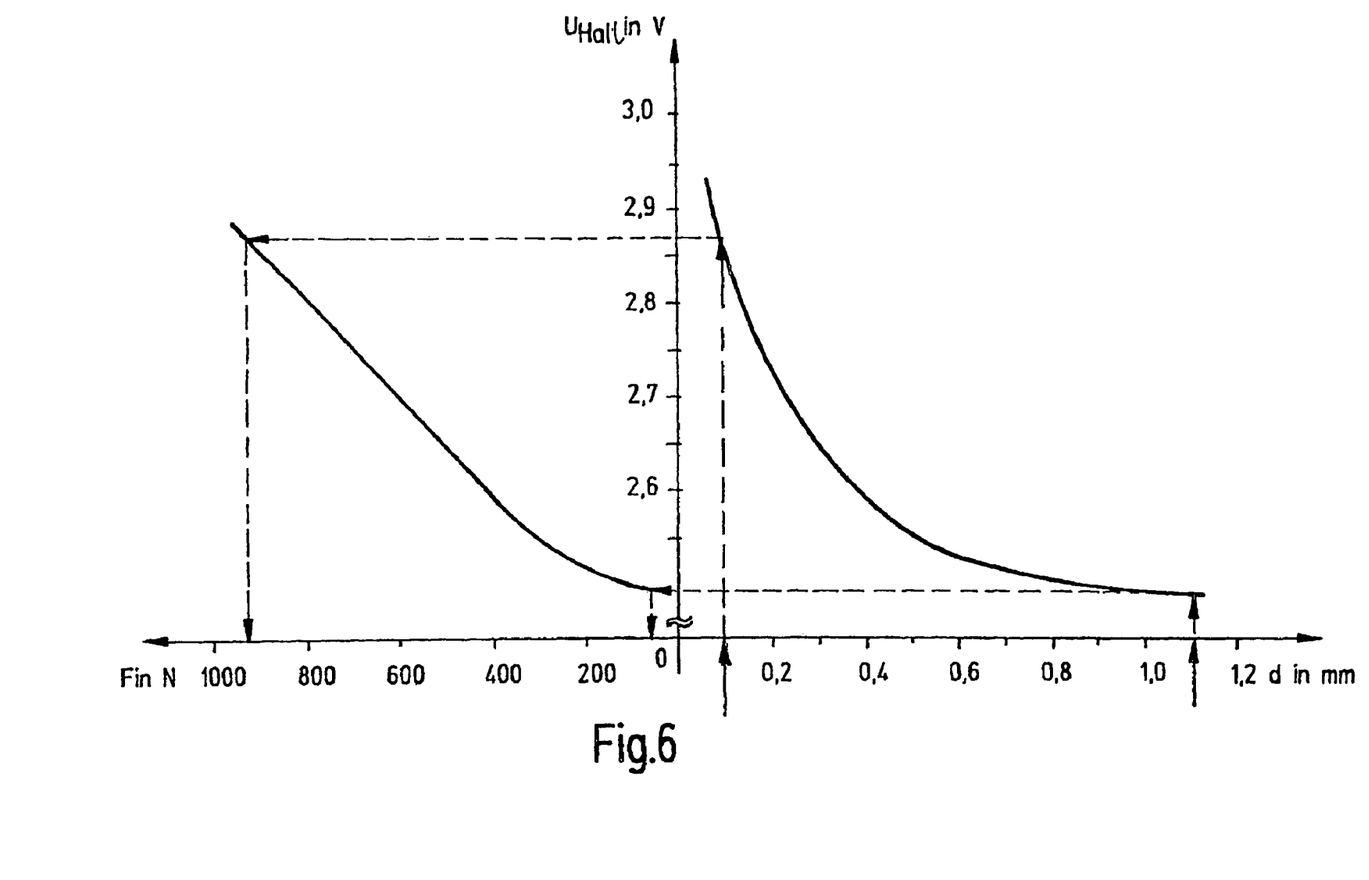
FIG. 6 is a diagram of the measured locking force of the locking system of the present invention.

FIG. 6 presents a diagram of a locking force F measured as a function of the distance d between actuator 3 and read head 2 in the case of a locking system 1 as illustrated in FIG. 4. The distance d was varied from 0.1 mm to 1.1 mm. The Hall voltages $U_{Hall}$ measured with the other Hall element 39 may be correspondingly associated with an empirically determined locking force F characteristic. Correlation of measured Hall voltage $U_{Hall}$ with locking force F depends in particular on the configuration of the other Hall element 39 relative to the electromagnet 7, on the geometry of the electromagnet 7, and on the geometry and material of the counterelement 12 on the actuator 3.

The value pair $U_{Hall}$/F generally determined with a prototype may be stored by electronic data storage in a reference table, or it may be found from the empirically determined values for the respective locking system 1. The measured values shown are based on a rated volume of the electromagnet 7. For this purpose, a Hall voltage of approximately 2.87 volts was measured at a distance d=0.1 mm, this corresponding to a locking force of more than 900 N. At a distance d=1.1 mm a Hall voltage of approximately 2.50 volts was measured, this corresponding to a locking force of approximately 60 N.

Figure 7:
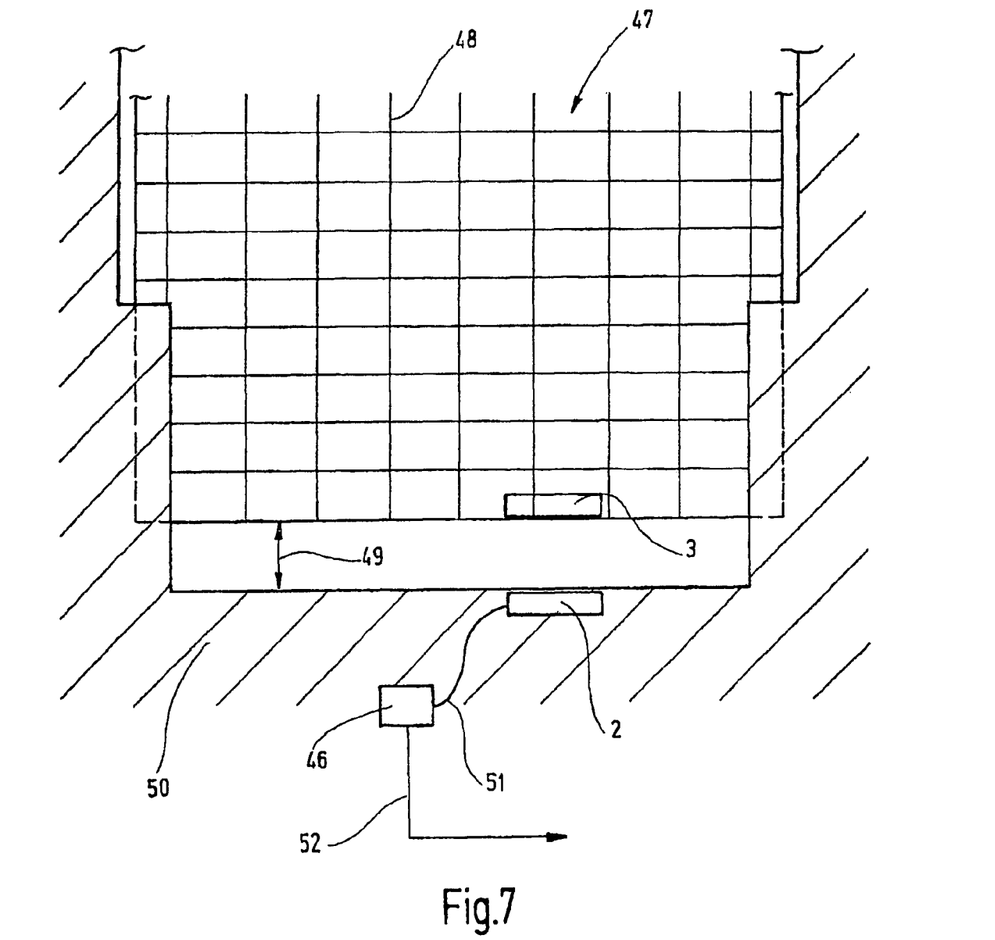
FIG. 7 is a diagram of a protective mechanism and a machine incorporating the locking system of the present invention.

FIG. 7 presents a diagram of a protective mechanism 47, for example, one with a protective grill 48 by which the operating area of a machine tool 50 may be closed off, in particular to protect operating personnel and to prevent access to the machine tool during operation. The protective grill 48 may be moved in the direction of the double arrow 49. The actuator 3 secured on the protective grill 48 operates when the grill is in the closed state in conjunction with the read head 2. In particular, signals are exchanged between the two component sets 10, 14. The closed state of the protective grill 48 may be determined by the electromagnet 7. The read head 2 is connected by the connecting line 51 to the evaluation unit 46, unless this unit is integrated with the read head. The evaluation unit 46 transmits signals to the control mechanism of the machine tool over the control line 52, in particular to signal the closed state of the protective grill 48, and thereby to indicate freeing of the machine tool for operation. Accordingly, the evaluation unit receives signals from the control mechanism, in particular for activation of the electromagnet 7 to determine the closed state of the protective grill 48 during operation of the machine tool.

While various embodiments have been chosen to illustrate the invention, it will be understood by those skilled in the art that various changes and modifications can be made therein without departing from the scope of the invention as defined in the appended claims.

The invention claimed is:

1. A locking system for a safety switch to monitor a protective device on a machine, comprising:
   - a read head having a first component set with electric structural components coupled to one of the protective device and the machine;
   - an actuator having a second component set with electric structural components mounted on the other of the protective device and the machine, said first and second components interacting without electrical contact to control the safety switch;
   - a switchable electromagnet mounted on one of said read head and said actuator and generating a magnetic field;
   - a counterelement mounted on the other of said read head and said actuator and operable with said electromagnet to lock said actuator on said read head by magnetic attraction of the magnetic field; and
   - a sensor element controlling a locking force of said actuator and said read head caused by the magnetic field and having an output signal being a function of the magnetic field generated by said electromagnet.

2. A locking system according to claim 1 wherein said sensor element generates an analog output signal being a function of an intensity of the magnetic field generated by said electromagnet.

3. A locking system according to claim 1 wherein magnitudes of said locking force are adjustable.

4. A locking system according to claim 1 wherein said sensor element measures said magnetic field generated by said electromagnet, and, taking into account geometric configurations and magnetic properties of said read head and said actuator, determines therefrom said locking force between said read head and said actuator.

5. A locking system according to claim 1 wherein said sensor element is mounted on said actuator.

6. A locking system according to claim 1 wherein said sensor element is mounted on said read head.

7. A locking system according to claim 1 wherein said sensor element has two switching states as functions of said magnetic field; and
said second component set is controlled by said switching states of said sensor element.

8. A locking system according to claim 1 wherein a generator coil is mounted in said actuator to supply electrical energy to said second component set.

9. A locking system according to claim 8 wherein said sensor element is electrically connected in series to said generator coil.

10. A locking system according to claim 1 wherein a plurality of sensor elements are mounted in said actuator and are interconnected to monitor locking.

11. A locking system according to claim 1 wherein said sensor element is mounted by adjusting means to vary positions thereof.

12. A locking system according to claim 1 wherein said sensor element is a read switch.

13. A locking system according to claim 1 wherein said sensor element is a Hall element.

14. A locking system according to claim 1 wherein said electromagnet is rigidly mounted on one of said read head and said actuator;
said counterelement is rigidly mounted on the other of said read head and said actuator; and
a coupling rigidly connects at least one of said counterelement and said electromagnet to a base element, while allowing pivoting relative to said base element.

* * * * *